(12) United States Patent
Haneda et al.

(10) Patent No.: US 6,195,370 B1
(45) Date of Patent: Feb. 27, 2001

(54) OPTICAL TRANSMISSION DEVICE AND METHOD FOR DRIVING LASER DIODE

(75) Inventors: Makoto Haneda, Takasaki; Hiroaki Hanawa, Hino, both of (JP)

(73) Assignees: Hitachi, Ltd.; Hitachi ULSI Systems Co., Ltd., both of Tokyo (JP)

( * ) Notice: Subject to any disclaimer, the term of this patent is extended or adjusted under 35 U.S.C. 154(b) by 0 days.

(21) Appl. No.: 09/462,992
(22) PCT Filed: Sep. 16, 1997
(86) PCT No.: PCT/JP97/03260
  § 371 Date: Jan. 18, 2000
  § 102(e) Date: Jan. 18, 2000
(87) PCT Pub. No.: WO99/14832
  PCT Pub. Date: Mar. 25, 1999

(51) Int. Cl.$^7$ .................................................. H01S 3/13
(52) U.S. Cl. .............................. 372/29; 372/38; 372/34
(58) Field of Search ................................ 372/29, 38, 34; 359/189; 250/205

(56) References Cited

U.S. PATENT DOCUMENTS

| 5,646,763 | * | 7/1997 | Misaizu et al. | 372/29 |
| 5,896,217 | * | 4/1999 | Ishikawa et al. | 359/189 |
| 5,900,621 | * | 5/1999 | Nagakubo et al. | 250/205 |

FOREIGN PATENT DOCUMENTS

| 4-152582 | 5/1992 | (JP) . |
| 5-190947 | 7/1993 | (JP) . |
| 6-45672  | 2/1994 | (JP) . |
| 6-61555  | 3/1994 | (JP) . |
| 7-147443 | 6/1995 | (JP) . |
| 7-221369 | 8/1995 | (JP) . |
| 8-204268 | 8/1996 | (JP) . |
| 9-214043 | 8/1997 | (JP) . |

* cited by examiner

*Primary Examiner*—Leon Scott, Jr.
(74) *Attorney, Agent, or Firm*—Mattingly, Stanger & Malur, P.C.

(57) ABSTRACT

An optical transmission device obtains driving control data corresponding to a temperature detected by a temperature detection circuit (112) from memory means (173), controls a driving current to be supplied to a laser diode (100) based on the driving control data, and measures a driving current to be actually supplied to the laser diode whose emission power is held constant by an automatic optical output control circuit (115, 113). Further, when the difference between the measured driving current and a driving current determined by the driving control data corresponding to the detected temperature at that time exceeds an allowable range, the optical transmission device updates the driving control data. Upon determination of the deterioration of the laser diode, the progress of the deterioration of the laser diode is determined based on the difference between a driving current defined by driving control data corresponding to a newly measured temperature and an actual driving current formed by automatic optical output control. Therefore, a distinction between whether an increase in driving current due to the automatic optical output control results from the deterioration of the laser diode and whether it results from a variation in ambient temperature is reliably made.

5 Claims, 9 Drawing Sheets

| TEMPERATURE (°C) | Eini | | | Ecor | | |
|---|---|---|---|---|---|---|
| | Ib(0) (mA) | Imod(0) (mA) | Id(0) (mA) | Id(t) (mA) | δId (mA) | δIb (mA) |
| 70 | 25.0 | 19.5 | 44.5 | | | |
| 71 | 25.5 | 19.7 | 45.2 | | | |
| 72 | 26.0 | 20.1 | 46.1 | | | |
| 73 | 26.6 | 20.4 | 47.0 | 55.6 | 8.6 | 6.0 |
| 74 | 27.2 | 20.7 | 47.9 | | | |
| ⋮ | ⋮ | ⋮ | 48.9 | | | |

TBL

OPTICAL TRANSMISSION DEVICE AND METHOD FOR DRIVING LASER DIODE

TECHNICAL FIELD

The present invention relates to an optical transmission device having a laser diode and a method for driving the laser diode, and specifically to a technique for optimizing a driving current of a laser diode even with respect to deterioration in characteristic of the laser diode due to secular changes, e.g., a technique effective for application to a digital optical communication system.

BACKGROUND ART

A laser diode emits light when a driving current thereof exceeds an oscillating threshold current (called simply threshold current). The intensity or power of emission thereof is proportional to a modulating current corresponding to the current exceeding the threshold current. In order to make fast the speed of response of an emitting operation of the laser diode, the threshold current or a neighboring current thereof is caused to flow at all times, and the modulating current is allowed to flow as a pulse current corresponding to a data signal in form superimposed on the bias current. As a result, an optical pulse can be generated.

The stable execution of optical communications needs to hold the intensity of light at its emission constant. At this time, the emission characteristic of the laser diode greatly depends on the temperature. Namely, the threshold current becomes great as the temperature rises. Further, the modulating current necessary to obtain predetermined emission power becomes also great as the temperature rises. The emission characteristic of the laser diode is deteriorated due to secular changes, and the threshold current becomes great as its using period becomes long. The modulating current necessary to obtain the predetermined emission power is also made great. Further, the characteristic change corresponding to the temperature and secular changes differs between the threshold current and the modulating current.

In order to cope with such a characteristic change, an auto power control technique has heretofore been adopted wherein the mean level of emission power of a laser diode is detected from a current flowing in a photodiode provided so as to be opposed to the laser diode and a bias current is increased by the amount equivalent to a reduction in the detected level, whereby fixed emission power can be obtained. Japanese Patent Application Laid-Open No. Hei 8-204268 is known as an example of a reference in which the present technique has been described.

In the above-described prior art, however, only the bias current is changed and no modulating current is controlled. Therefore, if the bias current exceeds the threshold current, then a quenching failure occurs. If the bias current is excessively smaller than the threshold current in reverse, then a quenching delay occurs. In a word, the prior art merely controls the sum of the bias current and the modulating current with respect to changes in threshold current of the laser diode and modulating current for obtaining fixed emission power of the laser diode due to a change in temperature and secular changes.

On the other hand, a technique for controlling a driving current of a laser diode while paying attention to both changes in threshold current corresponding to the temperature and modulating current for obtaining fixed emission power has been described in Japanese Patent Application Laid-Open No. Hei 6-61555. Namely, current ratio control data defining the ratio between the optimum bias current and modulating current for each operating temperature of the laser diode is prepared in a ROM or the like. The current ratio control data is read from the ROM in accordance with the result of detection of the operating temperatures of the laser diode, and reference is made to the driving current of the laser diode subjected to auto power control, whereby the bias current and modulating current are determined according to the current ratio control data with respect to the driving current.

However, the aforementioned prior art has no taken into consideration the deterioration in characteristic of the laser diode due to the secular changes. According to the discussions of the present inventors, it was revealed that if a distinction between whether an increase in driving current by the auto power control results from a change in ambient temperature and whether it results from deterioration in characteristic of the laser diode due to the secular changes would not be done, it was difficult to optimize both the bias current and the modulating current.

Further, the wavelength of output light also varies with the deterioration of the laser diode. This occurs because the laser diode is deteriorated and the driving current for obtaining the required optical output increases to thereby increase the temperature of an active layer of the laser diode and shift the output wavelength to the long-wave side. If the temperature of the active layer is lowered, then the wavelength of the optical output is shifted to the short-wave side. Such changes in wavelength cause a recognition error of a transmission signal in, for example, a system for performing wavelength-division multiplexing transmission.

An object of the present invention is to provide an optical transmission device capable of improving the reliability of light-based information transmission.

Another object of the present invention is to provide an optical transmission device which reduces a quenching failure and an emission delay to the minimum with respect to deterioration in characteristic of a laser diode due to a change in ambient temperature and secular changes to thereby make it possible to hold an optical output constant.

A further object of the present invention is to provide a method of reducing a quenching failure and an emission delay to the minimum with respect to deterioration in characteristic of a laser diode due to a change in ambient temperature and secular changes to thereby drive the laser diode.

A still further object of the present invention is to provide an optical transmission device capable of relaxing a change in the wavelength of an emission output.

DISCLOSURE OF THE INVENTION

An optical transmission device according to the present invention comprises a laser diode, a current supply circuit for supplying a bias current and a modulating current superimposed on the bias current to the laser diode as driving currents, an automatic optical output control circuit for supplementing the shortage of the driving currents so that emission power of the laser diode is held constant, a temperature detection circuit for detecting an ambient temperature of the laser diode, memory means storing driving control data for determining a modulating current and a bias current necessary to obtain predetermined emission power therein for each predetermined temperature, and control means for obtaining driving control data corresponding to the temperature detected by the temperature detection circuit from the memory means, controlling each driving current to be supplied from the current supply circuit to the laser diode, based on the obtained driving control data, measuring each driving current actually supplied to the laser diode whose emission power is held constant by the automatic optical output control circuit, detecting whether the difference between the measured driving current and a driving current determined according to the driving control data corresponding to the detected temperature at that time exceeds an allowable range, and updating the driving control data related to the corresponding temperature, on the memory means so that the difference between the driving currents is defined as each of increases in bias current and modulating current.

The range allowable for the increase in driving current is a range in which a quenching failure and an emission delay substantially show no problem when automatic optical output control is effected on a driving current formed by driving control data at a given temperature, for example. This can be defined as a current corresponding to about a few % of the driving current, for example.

According to the above-described means, the driving control data corresponding to the detected temperature is used to control the driving current of the laser diode. Upon determination of the deterioration of the laser diode, the ambient temperature of the laser diode is further measured and a decision is made as to whether the difference between a driving current defined by driving control data corresponding to the newly measured temperature and an actual driving current formed by the automatic optical output control exceeds an allowable value. When the difference is found to exceed the allowable value, it is determined that the deterioration of the laser diode has been advanced. Thus, a distinction between whether the increase in driving current due to the automatic optical output control results from the deterioration of the laser diode and whether it results from a variation in ambient temperature is reliably done. The driving control data corresponding to the corresponding temperature is updated based on the difference between the driving currents used to determine the deterioration of the laser diode. After the renewal of the driving control data, the driving current for the laser diode is controlled using the corresponding updated driving control data. Thus, a quenching failure and an emission delay are limited to the minimum with respect to both the change in ambient temperature and the characteristic deterioration of the laser diode due to secular changes, whereby an optical output can be held constant.

Once the driving control data is updated, the driving currents under the corresponding temperature are set as a bias current and a modulating current determined by the updated driving control data. The subsequent detection of the deterioration in the laser diode is carried out by determining whether the difference between the driving current determined by the corresponding updated driving control data and the driving current subjected to the automatic optical output control exceeds the allowable value. Thus, when the progress of the deterioration of the laser diode is detected, the previously-stored driving control data is renewed into driving control data including information for defining the newly-acquired amount of correction. Thereafter, the driving current of the laser diode is determined according to the updated correction driving control data.

The driving control data comprises initial data for initially determining the bias current and the modulating current for each predetermined temperature, and correction data subsequently added to the initial data. At this time, the correction data can be set as data for defining the difference between the driving currents as each of the increases in bias current and modulating current. Described more specifically, the control means can include data about the difference between the driving currents and a value obtained by increasing the difference between the driving currents by a factor of a constant ratio smaller than 1 in the correction data as data about an increase in bias current. At this time, the control means determines a bias current by the sum of the initial bias current data included in the initial data and the data about the increase in bias current included in the correction data when the driving current for the laser diode is determined based on the initial data and the correction data, and adds the initial modulating current data included in the initial data to the difference between the data about the difference between the driving currents and the data about the increase in bias current respectively included in the correction data, thereby making it possible to determine a modulating current.

In order to relax a change in wavelength incident to a rise in the temperature of the laser diode, a cooling device capable of selectively cooling the laser diode is further provided. The control means is capable of lowering an ambient temperature of the laser diode by a predetermined temperature by the cooling device each time the difference between the measured driving currents reaches a predetermined value with respect to a driving current defined by initial driving control data or a driving current defined by correction driving control data and the initial driving control data.

BEST MODE FOR CARRYING OUT THE INVENTION

<<Optical Transmission Device>>

Figure 1:
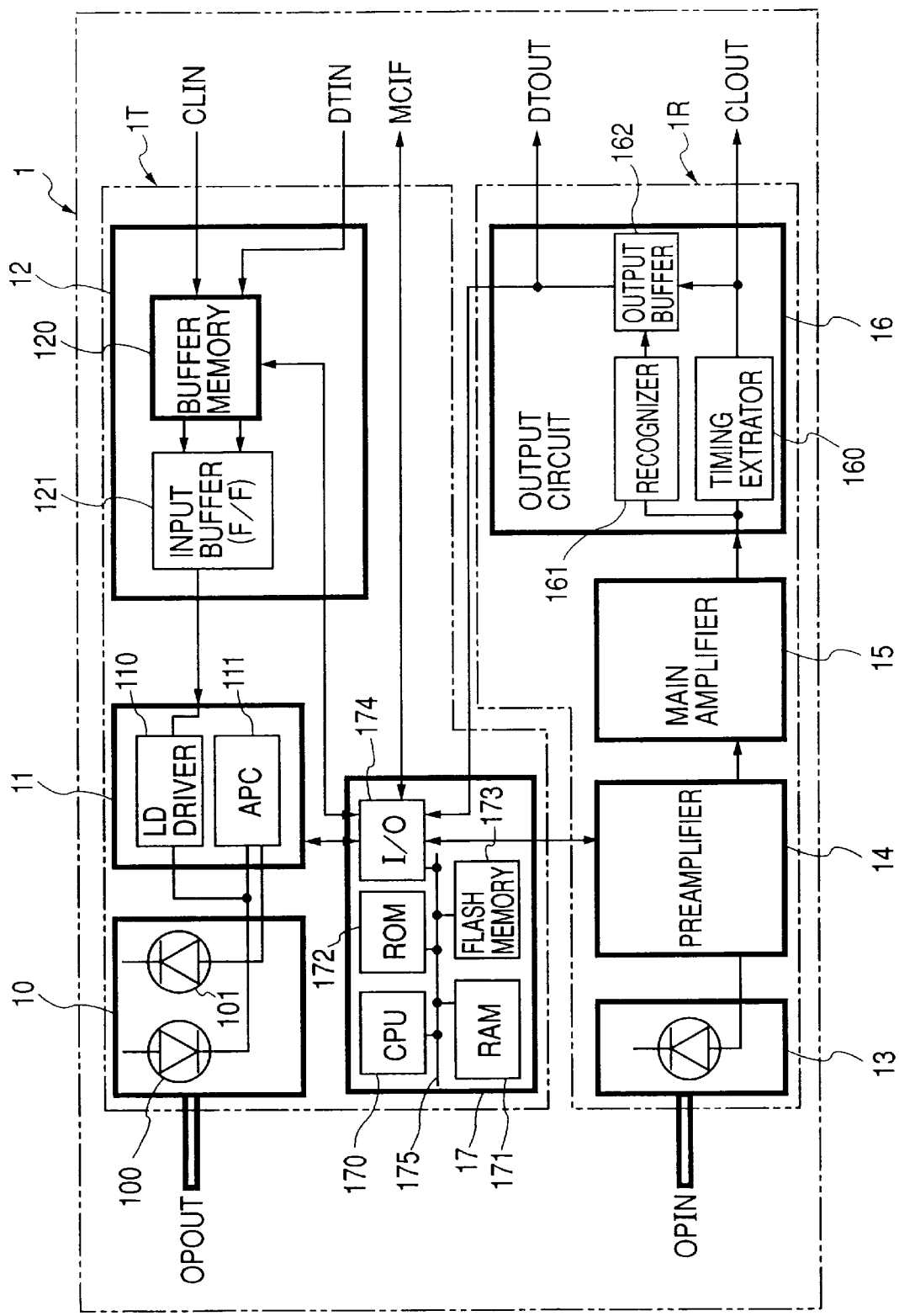
FIG. 1 is a block diagram showing one example of an optical transmission device according to the present invention with an optical transceiver as the core.

One embodiment of an optical transmission device is illustrated in FIG. 1 with an optical transceiver as the core. An optical transceiver 1T and an optical receiver 1R are typically illustrated in the optical transmission device 1 shown in the same drawing. Although not restricted in particular, the optical transceiver 1T is provided with a laser diode module 10, a driver circuit 11, an input circuit 12, and a microcomputer 17 respectively individually brought into semiconductor integrated circuits. The optical receiver 1R includes a pin photodiode 13, a pre-amplifier 14, a main amplifier 15 and an output circuit 16 respectively individually brought into semiconductor integrated circuits.

The laser diode module 10 has a laser diode (also described as LD) 100 and a photodiode (also described as PD) 101 for monitoring. An optical output of the laser diode 100 is outputted to an optical output terminal OPOUT. The pin photodiode 13 receives a light or lightwave signal from an optical input terminal OPIN. The input circuit 12 is connected to a data input terminal DTIN and a clock input terminal CLIN, whereas the output circuit 16 is connected to a data output terminal DTOUT and a clock output terminal CLOUT.

The input circuit 12 has a buffer memory 120 and an input buffer 121 such as a D type flip flop (F/F) or the like. The buffer memory 120 successively stores data signals sent from the data input terminal DTIN in synchronism with a clock signal inputted from the terminal CLIN. The data stored in the buffer memory 120 is supplied to the input buffer 121 in synchronism with the clock signal supplied from the clock input terminal CLIN, where it is waveform shaped, followed by supply to the driver circuit 11.

The driver circuit 11 has an LD driver 110 and an auto power controller (APC) 111. The LD driver 110 allows a bias current corresponding to a threshold current of the LD100 to flow in the LD100 and selectively supplies a modulating current for on/off-controlling the LD100 to the LD100 in response to each data signal supplied from the input buffer 120.

The PD101 effects photoelectric conversion on light outputted from the LD100 to form or produce a current corresponding to the intensity or power of emission of the LD100. The APC111 auxiliarily controls a driving current supplied to the LD100, based on the current flowing in the PD101 so that the emission power of the LD100 becomes constant. The microcomputer 17 performs basic control related to the bias current and modulating current on the LD driver 110. The details thereof will be described later. The optical output of the LD100 is supplied from the optical output terminal OPOUT to a transmission line such as an optical fiber or the like.

The pin photodiode 13 detects the light signal supplied to the optical input terminal OPIN from the transmission line and converts or transforms it to a received signal current. The received signal current is converted into a voltage signal by the pre-amplifier 14. The converted voltage signal is supplied to the main amplifier 15. The main amplifier 15 amplifies the input voltage signal up to an ECL level. The output circuit 16, which receives the output of the main amplifier 15 therein, has a timing extractor 160, a recognizer or identifier 161 and an output buffer 162 like a flip-flop. The timing extractor 160 divides the input signal into two systems. Further, the timing extractor 10 delays one of them and ANDs it and the other thereof to thereby produce a pulse containing a clock component of, for example, 155.52 MHz. Only the clock component of 155.52 MHz is extracted from the pulse by an unillustrated SAW (Surface Acoustic Wave) filter and limit-amplified to produce a clock signal. The identifier 161 sufficiently amplifies the input signal supplied from the main amplifier 15 and waveshapes it into a signal whose waveform's upper and lower portions are sliced. The output buffer 162 performs waveform shaping (suppression on pulse-width distortion) on the so-sliced signal, using the clock signal. The output of the output buffer 162 is supplied to the data output terminal DTOUT and the clock signal produced by the timing extractor 160 is supplied to the clock output terminal CLOUT.

The optical transceiver 1T shown in FIG. 1 is provided with the microcomputer 17. Although not restricted in particular, the microcomputer 17 is used even for control of the optical receiver 1R.

Although not restricted in particular, the microcomputer 17 has a CPU (Central Processing Unit) 170, a RAM (Random Access Memory) 171, a ROM (Read Only Memory) 172, a flash memory 173 illustrative of one example of an electrically erasable and programmable non-volatile memory device, an input/output (I/O) circuit 174, etc. They are connected to an internal bus 175. Although not restricted in particular, the ROM172 is a mask ROM which stores constant data or the like therein, whereas the RAM171 is defined as a work area or region of the CPU170. Further, the flash memory 173 holds an operating program, driving control data, etc. for the CPU170 therein so that they are programmable.

The microcomputer 17 is a circuit for controlling the optical transmission device 1 over its entirety. The driving control data for the LD100 is stored in the flash memory 173. When the LD100 is driven to transmit light, the CPU170 reads driving control data corresponding to a temperature detected by a temperature sensor 112 to be described later from the flash memory 173 and performs driving control of the LD100 by the LD driver 110, based on the read data. Namely, a data table (driving control data table) created based on a temperature characteristic of the LD100 is prepared in the flash memory 173. Thereafter, the CPU170 controls a driving current flowing in the LD100 in conformity with the temperature characteristic of the LD100 according to the optical output, temperature, etc. necessary for the LD100. The contents of control on the driving current will be described later. In addition to the above, the microcomputer 17 controls the gain of the pre-amplifier 14 by switching.

The microcomputer 17 is connected to an unillustrated protocol controller or the like lying within the optical transmission device through a microcomputer interface terminal (also called micon interface terminal) MCIF so as to be supplied with instructions for transmission and reception control, etc. The micon interface terminal MCIF is connected to a mode terminal of the microcomputer 17 and a predetermined port of the input/output circuit.

The microcomputer 17 has, for example, a boot mode in addition to a user program mode. When the user program mode is set to the microcomputer 17, the CPU170 executes the operating program stored in the flash memory 173. The boot mode is an operation mode for allowing the flash memory 173 to be rewritten or programmed directly from outside the microcomputer 17. When the boot mode is set to the microcomputer 17, the input/output circuit 174 is brought to a signal input/output state capable of externally directly programming or rewriting the flash memory 173. Namely, when the boot mode is set, a rewriting high voltage, a program signal, addresses and data can be transferred to and from the flash memory 173 through the micon interface terminal MCIF. By using the boot mode, the driving control data can initially be written into the flash memory 173 and the operating program for the CPU170 can be written into the flash memory 173. It is also possible to rewrite the flash memory 173. The writing and rewriting of data into the flash memory 173 can be carried out even by the user program mode of the microcomputer 17. The driving control data written into the flash memory 173 can be reprogrammed under the control of the CPU170.

Figure 2:
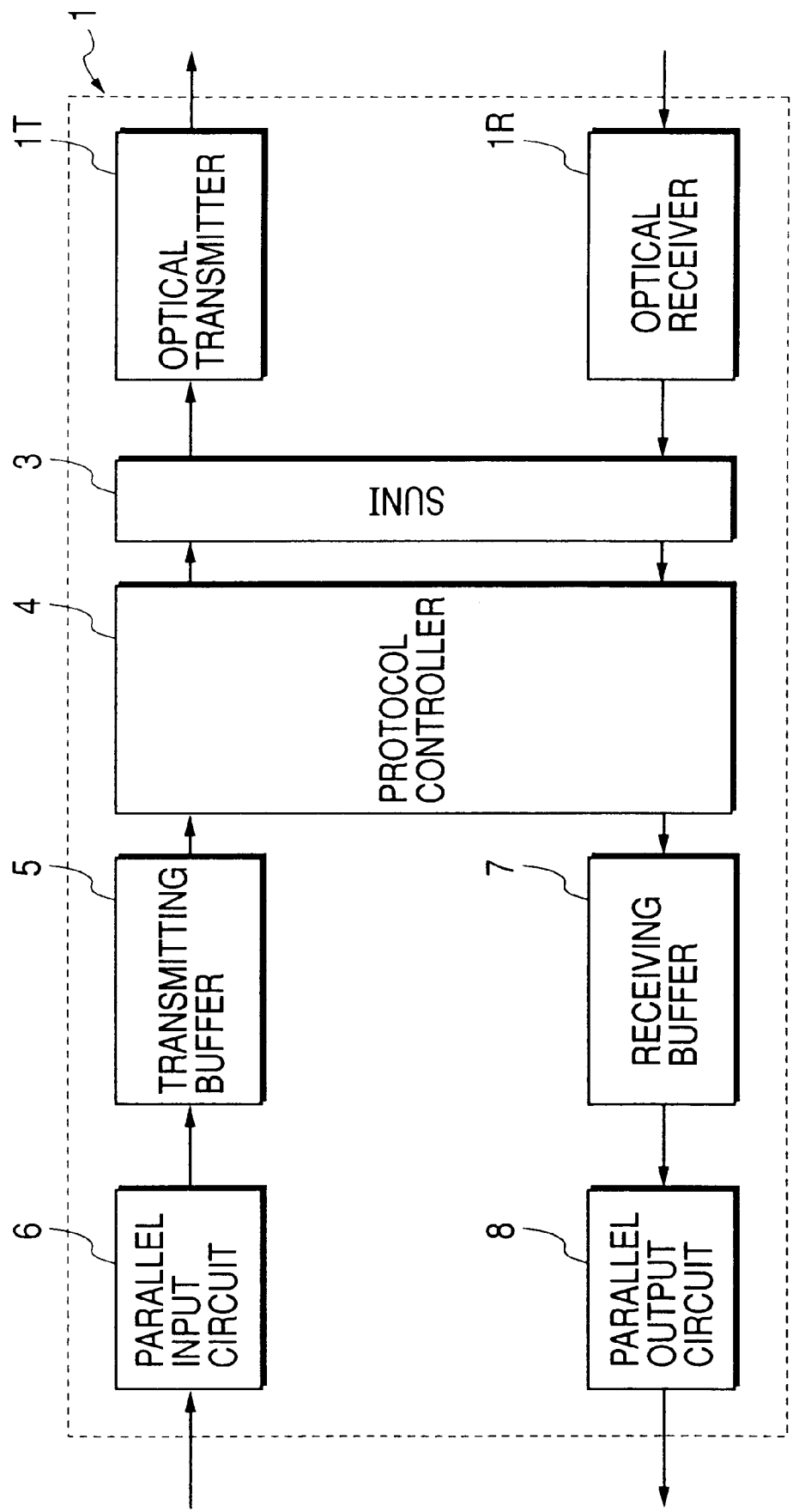
FIG. 2 is a block diagram schematically illustrating the entire optical transmission device constructed as an interface board.

FIG. 2 is an overall block diagram of the optical transmission device. Although not restricted in particular, the optical transmission device shown in the same drawing constitutes one of a large number of interface boards which make up of an ATM switch or the like. The optical transceiver 1T and the optical receiver 1R are connected to an optical trunk network by an optical fiber. A SUNI (Serial User Network Interface) 3 is provided at a stage subsequent to the optical transceiver 1T and the optical receiver 1R. Deserialization or serial-parallel conversion of data is done at a portion of the SUNI3, which is connected to the optical transceiver 1T, whereas serialization or parallel-serial conversion of data is carried out at a portion of the SUNI3, which is connected to the optical receiver 1R. When the protocol controller 4 supports an ATM (Asynchronous Transfer Mode), it performs assembly/de-assembly of each data cell and multiplexing/de-multiplexing thereof. A transmit signal is supplied to the protocol controller 4 through a parallel input circuit 6 and a transmitting buffer 5. A receive signal is supplied from the protocol controller 4 to a parallel output circuit 8 through a receiving buffer 7. The parallel input circuit 6 and the parallel output circuit 8 are connected to another switch through, for example, an unillustrated interface cable or the like.

<<Optical Transceiver>>

Figure 3:
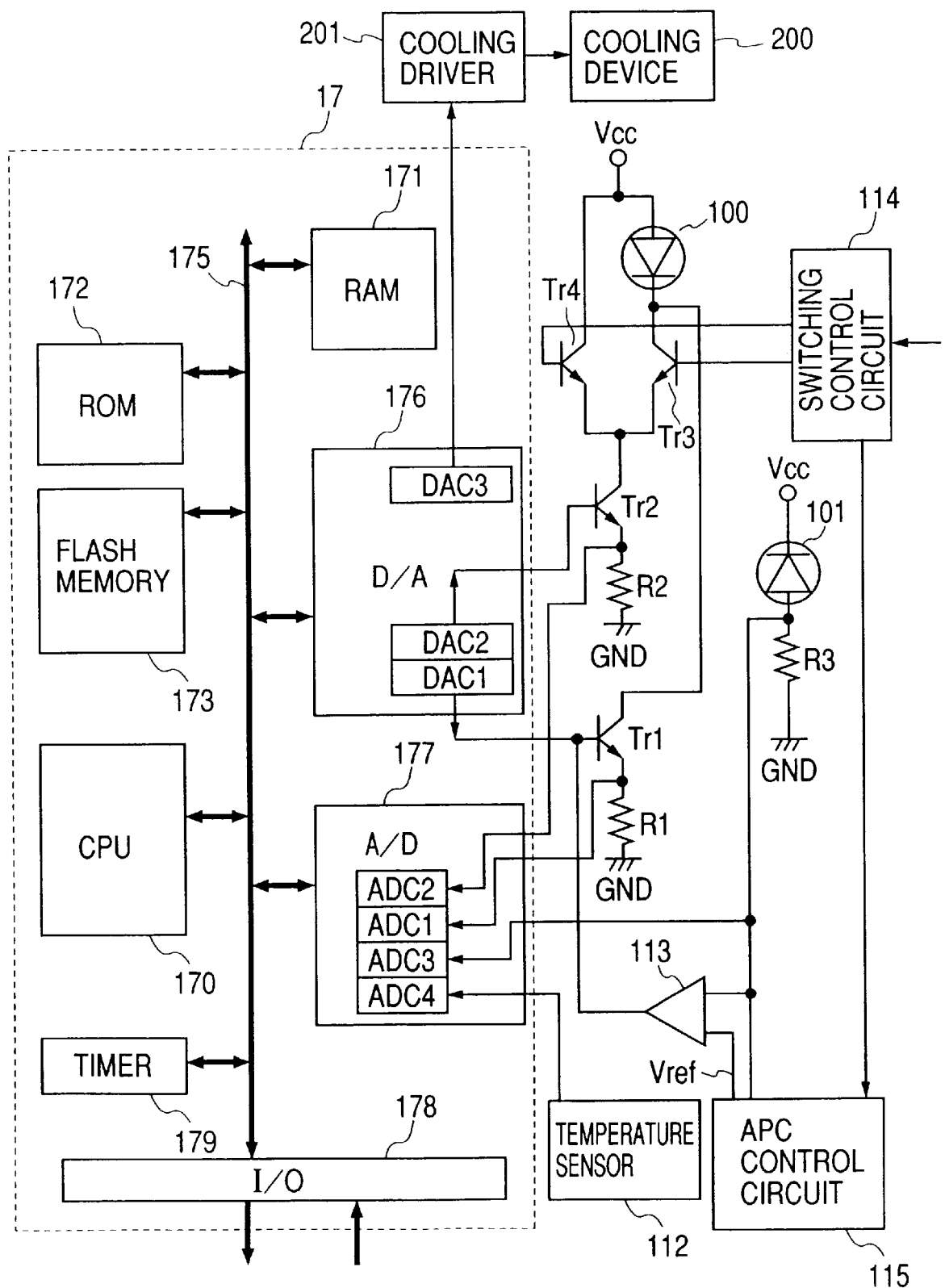
FIG. 3 is a circuit diagram depicting one detailed example of the optical transceiver.

FIG. 3 shows one detailed example of the optical transceiver 1T. The LD driver 110 has a transistor Tr1 for determining a bias current fed through the LD100 and a transistor Tr2 for determining a modulating current to be supplied to the LD100, as current source transistors. Transistors Tr3 and Tr4 are switching transistors for controlling on and off of the modulating current fed through the LD100. The transistors Tr1 through Tr4 are constructed as npn type bipolar transistors.

The transistors Tr3 and Tr4 are electrically connected in parallel. A common emitter thereof is electrically connected to the collector of the transistor Tr2. The emitter of the transistor Tr2 is coupled to a ground voltage GND through a resistor R2. The cathode of the LD100 is electrically connected to the collector of the transistor Tr3. The anode of the LD100 and the collector of the transistor Tr4 are commonly connected to a source voltage Vcc.

Figures 4, 5:
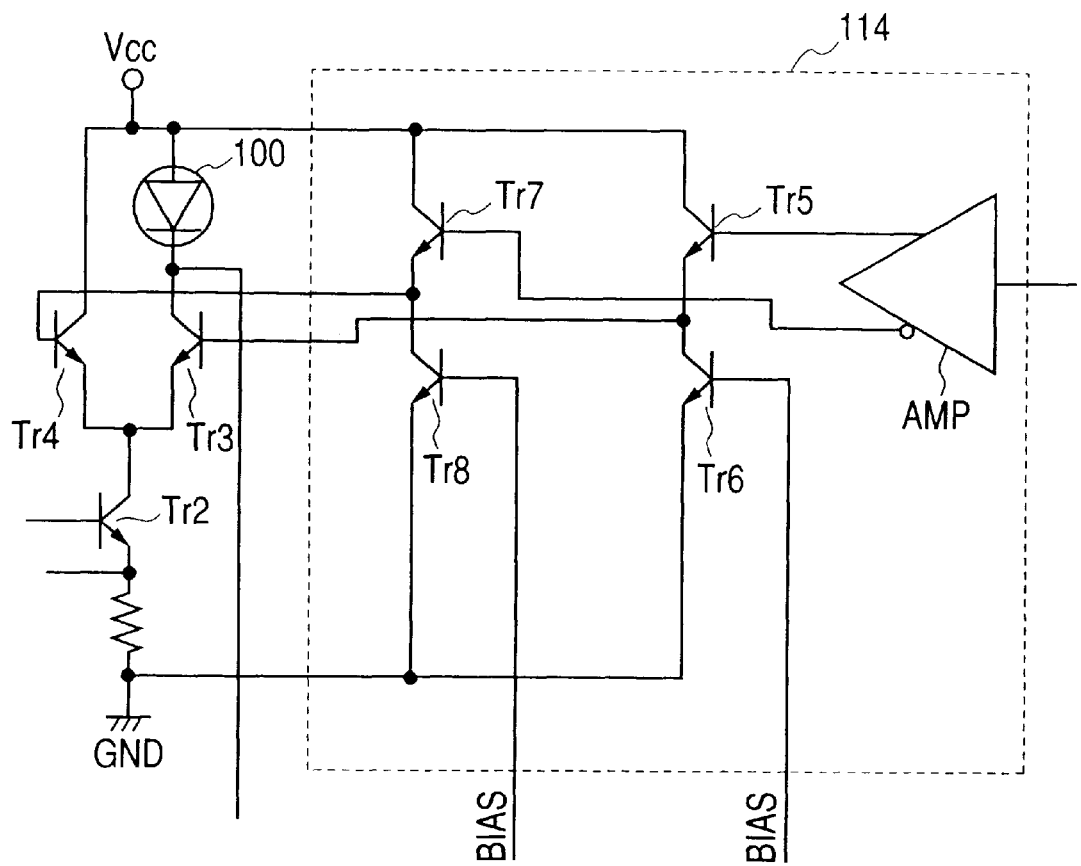
FIG. 4 is a circuit diagram showing one example of a switching control circuit for allowing a modulating current to flow in a diode in pulse form.
FIG. 5 is an explanatory view illustrating one example of a driving control data table.

As one detailed example of a switching control circuit 114 for the transistors Tr3 and Tr4 is illustrated in FIG. 4, a series circuit of transistors Tr5 and Tr6 and a series circuit of transistors Tr7 and Tr8 are placed between the source voltage Vcc and the ground voltage GND. The transistors Tr5 through Tr8 are constructed as npn bipolar transistors. The bases of the transistors Tr6 and Tr8 are biased by a predetermined voltage and serve as load resistors for the transistors Tr5 and Tr7. In other words, the series circuit of the transistors Tr5 and Tr6 and the series circuit of the transistors Tr7 and Tr8 respectively constitute emitter follower circuits. The emitter of the transistor Tr5 is electrically connected to the base of the transistor Tr3, and the emitter of the transistor Tr7 is electrically connected to the base of the transistor Tr4.

The bases of the transistors Tr5 and Tr7 are supplied with a differential output produced from a differential output amplifier AMP. When their inputs are reversed, the states of potentials applied to the bases of the transistors Tr3 and Tr4 are inverted. The amplifier AMP is supplied with the output of the selector 121.

When the potential applied to the base of the transistor Tr3 is brought to a high level, the transistor Tr3 is shifted to a saturated state. When the base of the transistor Tr4 is brought to the high level, the transistor Tr4 is shifted to the saturated state. The transition of the transistors Tr3 and Tr4 to the saturated states is complementarily carried out so that the transistors Tr3 and Tr4 are complementarily switched, thus causing a pulse-shaped modulating current to flow in the LD100 through the current source transistor Tr2.

As shown in FIG. 3, the collector of the transistor Tr1 is electrically connected to the collector of the transistor Tr3, whereas the emitter thereof is electrically connected to the ground voltage GND through a resistor R1. The transistor Tr1 allows a bias current equivalent to a threshold current to flow in the LD100 according to the base voltage applied thereto.

The PD101 is electrically series-connected to a resistor R3 and placed in a backward connected state between the source voltage Vcc and the ground voltage GND. The PD101 supplies a current corresponding to emission intensity or power outputted from the LD100.

Referring to FIG. 3, the input/output circuit 174 of the microcomputer 17 is illustrated in form divided into a digital-analog converter (D/A) 176 for converting a digital signal into an analog signal, an analog-digital converter (A/D) 177 for converting an analog signal to a digital signal, a timer 179 and another input/output circuit 178. The D/A176 has three D/A conversion channels DAC1 through DAC3, and the A/D177 has four A/D conversion channels ADC1 though ADC4.

The D/A conversion channel DAC3 has an intrinsic register accessed by the CPU7 and output a signal for driving a cooling driver 201 to be described later. The D/A conversion channels DAC1 and DAC2 respectively have intrinsic registers accessed by the CPU170. Further, the D/A conversion channels DAC1 and DAC2 convert values of the corresponding registers into D/A form and outputs base bias voltages for the transistors Tr1 and Tr2. Although not restricted in particular, each of the D/A conversion channels DAC1, DAC2 and DAC3 converts a 8-bit digital signal to an analog signal in a 256-step gradation.

As described above, the modulating current to be fed through the transistor Tr3 in accordance with on/off-control of the optical output is determined according to driving control data set to the D/A conversion channel DAC2 by the CPU170. The bias current to be fed through the LD100 is determined according to driving control data set to the D/A conversion channel DAC1 by the CPU170.

Thus, the CPU170 is capable of individually and arbitrarily controlling the modulating current and bias current capable of being supplied to the LD100 in accordance with the driving control data set to the D/A conversion channels DAC1 and DAC2. Thus, the CPU170 sets data corresponding to the temperature characteristic of the LD100 or the like with respect to a use condition (use atmospheric temperature) of the optical transmission module 1 to the D/A conversion channels DAC1 and DAC2, in other words, the CPU170 sets data corresponding to a bias current equivalent to the threshold current of the LD100 at a use ambient or environmental temperature at that time to the D/A conversion channel DAC1 and sets data corresponding to a modulating current to be added to the bias current to the D/A conversion channel DAC2 to obtain necessary emission intensity or power under the temperature thereof, thereby making it possible to light-produce and drive the LD100 without a quenching error and an emission delay.

The A/D conversion channels ADC1 through ADC4 are successively assigned to their corresponding inputs of an emitter voltage of the transistor Tr1, an emitter voltage of the transistor Tr2, an anode voltage of the PD101 and an output voltage of the temperature sensor 112, and have registers inherent in them, for holding the results of A/D conversion of the assigned input voltages therein so as to be accessible by the CPU170. Although not restricted in particular, the A/D conversion channels ADC1 through ADC4 respectively have 10-bit conversion accuracy.

Thus, the CPU170 is capable of monitoring a bias current fed through or flowing in the transistor Tr1, a modulating current flowing in the transistor Tr2, a current flowing in the PD201, and the output of the temperature sensor 10 through the A/D converter 177 as needed. Although not restricted in particular, the operation of the CPU170 for monitoring their information can be carried out each time the CPU170 receives a timer interrupt given from the timer 179.

The output of the monitor PD101 is made available even to auto power control (automatic optical output control). The APC111 shown in FIG. 1 is comprised of, for example, a comparator 113 and an APC control circuit 115 shown in FIG. 3. Namely, the comparator 113 receives an anode voltage corresponding to a current fed through the PD101 according to actual emission power of the LD100, determines whether the input voltage is smaller than a reference potential Vref corresponding to predetermined emission power, superimposes a signal corresponding to the result of determination over the signal outputted from the D/A conversion channel DAC1 and supplies it to a base electrode of the transistor Tr1, and increases or decreases a bias current fed through the LD100 through the transistor Tr1. The APC control circuit 115 is a circuit for forming the reference potential Vref, which forms the reference potential Vref, based on the mean value of current fed through the PD101 according to the emission power of the LD100 and the mean value (mark rate) relative to the input signal of the amplifier AMP at that time. Although not restricted in particular, the auto power control is supplementary to bias current control based on the output of the D/A conversion channel DAC1. Namely, it supplements an error unable to be followed up by the bias current and modulating current based on the output of the D/A176.

The CPU170 can monitor the anode voltage of the PD101 through the A/D conversion channel ADC3, recognize the actual emission intensity or power of the LD100, and detect, for example, a state in which the actual emission power is reduced with respect to target emission power. The CPU170 is capable of monitoring the emitter voltage of the transistor Tr1 through the A/D conversion channel ADC1, converting the monitored voltage to a current, comparing the value of the converted current and a bias current to be fed through the transistor Tr1 via the D/A conversion channel DAC1, and detecting an abnormal variation in bias current, based on the difference therebetween. Similarly, the CPU170 is capable of monitoring the emitter voltage of the transistor Tr2 through the A/D conversion channel ADC2, converting the monitored emitter voltage to a current, comparing the value of the converted current and a modulating current to be fed through the transistor Tr2 via the D/A conversion channel DAC2, and detecting an abnormal variation in modulating current, based on the difference therebetween.

Further, the CPU1710 monitors the emitter voltages of the transistors Tr1 and Tr2 through the A/D conversion channels ADC1 and ADC2 respectively and converts the monitored voltages to their corresponding currents, thereby making it possible to measure a driving current (corresponding to the sum of the bias current and the modulating current) fed through the LD100 in practice. The measured current also includes an increase in bias current by the auto power control. Accordingly, the CPU170 is capable of grasping or keeping track of the difference between the driving current measured in this way and the driving current to be supplied to each of the transistors Tr1 and Tr2 through each of the D/A conversion channels DAC1 and DAC2.

<<Driving Control Data for LD>>

The driving control data for determining the modulating current and the bias current to be supplied to the LD100 is stored in a driving control data table. The driving control data table includes data to be set to the D/A conversion channels DAC1 and DAC2 for each use environmental temperature in order to obtain a predetermined target optical output and is formed in the flash memory 173 of the microcomputer 170.

FIG. 5 shows one example of the driving control data table TBL. The driving control data table TBL has an initial data region Eini and a correction data region Ecor. The respective regions Eini and Ecor are associated with each other every temperatures.

Initial data corresponding to an initial temperature characteristic of the LD100 is stored in the initial data region Eini. The initial data is data for determining a bias current and a modulating current for obtaining the intended emission intensity or power every temperatures. For example, data about an initial bias current Ib(0), data about an initial modulating current Imod(0) and data about their total current (driving current) Id(0) necessary to obtain a fixed emission power like 0.8 mW are held in the initial data region for each predetermined temperature.

Figure 6:
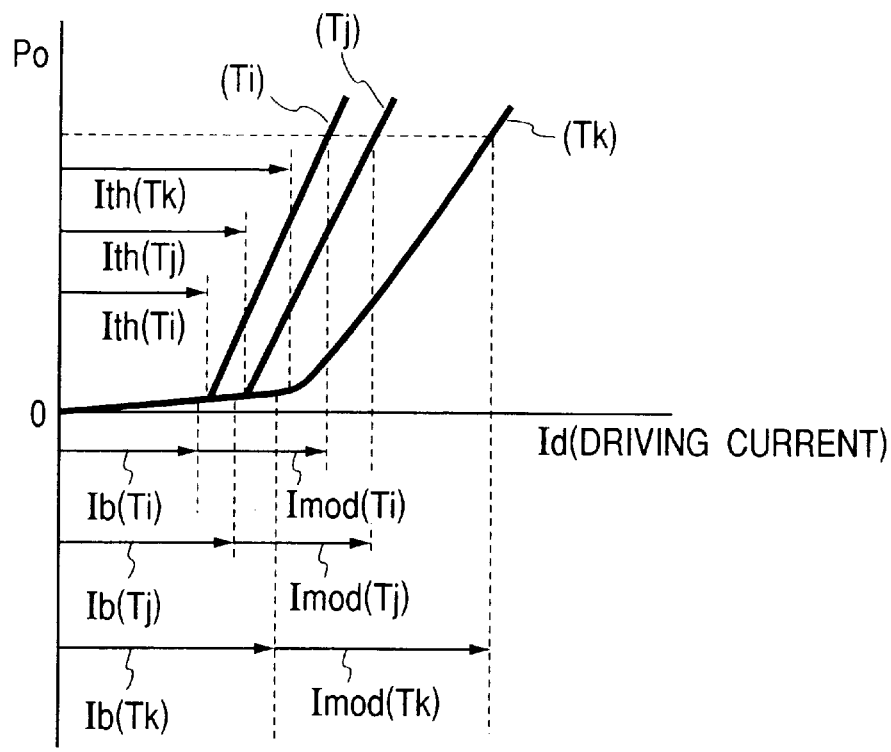
FIG. 6 is an explanatory view depicting the relationship between a driving current and emission power of an LD.
Figure 7:
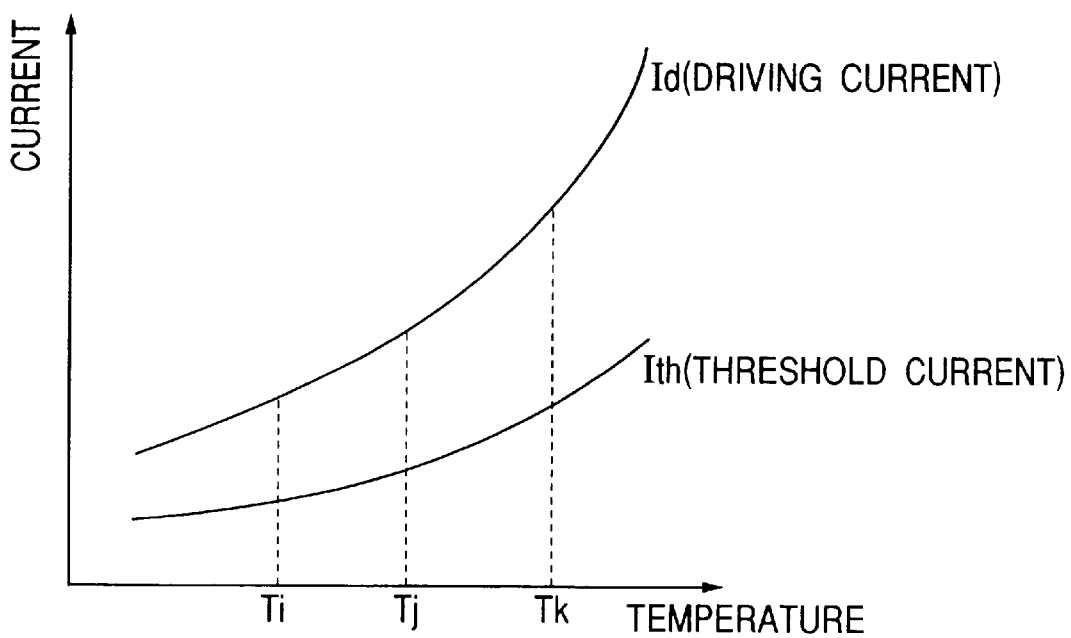
FIG. 7 is an explanatory view showing a temperature characteristic of the LD.

The relationship between the driving current (Id) and emission power (P0) of the LD100 is shown in FIG. 6, for example. Bias currents Ib(Ti), Ib(Tj) and Ib(Tk), threshold currents Ith(Ti), Ith(Tj) and Ith(Tk), and modulating currents Imod(Ti), Imod(Tj) and Imod(Tk) at typically-illustrated temperatures Ti, Tj and Tk are shown in the same drawing. Each bias current referred to above is set to a current corresponding to about 90% of its corresponding threshold current, for example. As is apparent from FIG. 6, if the temperature rises when attempt is made to obtain the fixed emission power, then both the threshold and modulating currents must be made great according to its rise. On the other hand, a temperature characteristic of the LD100 is shown in FIG. 7. Since the threshold current Ith and the driving current Id respectively show a characteristic nonlinear with respect to the temperature as is apparent from the same drawing, it is necessary to control even the bias current Ib and the modulating current Imod non-linearly with respect to the temperature (T) in a manner similar to the above. Particularly, since the threshold current Ith increases suddenly as the temperature rises, a control method for varying the bias current Ib simply linearly with respect to the temperature encounters difficulties in most suitably setting the bias current Ib. Namely, when the temperature varies during the execution of the auto power control, the driving current of the LD100 increases or decreases so that the intensity of light becomes constant. However, the setting of the bias current cannot follow a variation in threshold current Ith and hence the modulating current Imod cannot be set to the optimum value either in a manner similar to the above. In the optical transceiver 1T, data about the optimum bias current Ib(0) and modulating current Imod(0) corresponding to the temperature characteristics related to the initial threshold current Ith and driving current Id of the LD100 are stored in the initial data region Eini for each predetermined temperature. Thus, if the LD100 is driven using the data about the initial bias current Ib(0) and initial modulating current Imod(0) of the LD100, corresponding to the respective temperatures, then an emission delay and a quenching failure can substantially be solved.

The correction data region Ecor shown in FIG. 5 includes data about a difference bias current δIb and data about a difference driving current δId as correction data for defining each current superimposed on a bias current and a modulating current defined by the initial data. Data about a driving current Id(t) stored in the correction data region Ecor is data which means a current obtained by superimposing a current defined based on the data about the difference driving current δId on a driving current Id(0) defined based on the data about the initial bias current Ib(0) and the data about the initial modulating current Imod (0). Incidentally, while the driving control data shown in FIG. 5 are illustrated as data expressed in mA units for convenience, the driving control data are actually defined as digital data set every temperatures for defining such current values.

Figure 8:
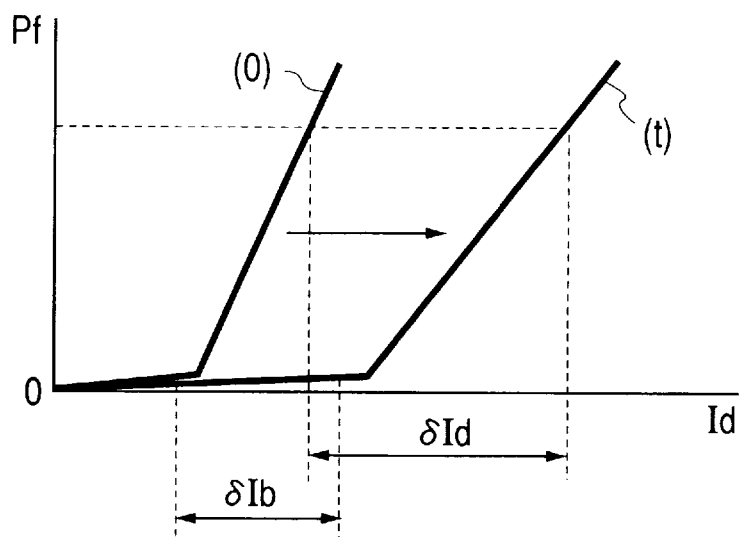
FIG. 8 is an explanatory view illustrating deterioration-life relationship between a driving current Id and emission power Pf of the LD under a fixed temperature environment.

FIG. 8 shows the fore-and-aft relationship of life and degradation between a driving current Id and emission power Pf of the LD100 under a fixed temperature environment. In FIG. 8, (0) shows one example of an initial Id-Pf characteristic of the LD100, and (t) indicates one example of an Id-Pf characteristic of the LD100 after the elapse of a predetermined period. The characteristic indicated by (t) is a characteristic deteriorated due to secular changes. Both the bias current and modulating current must be increased to obtain the same emission power. When the characteristic changes from (0) to (t) due to the secular changes, the whole driving current must be increased by δId with respect to the characteristic indicated by (0) to obtain the same emission power. The driving current with respect to the initial characteristic indicated by (0) can be determined based on the initial data. When the characteristic is deteriorated, the CPU170 controls the driving current of the LD100 so that the bias current is increased by δIb and the modulating current is increased by δId−δIb. Data for determining increases in bias current and modulating current due to the deterioration of the characteristic of the LD respectively correspond to the data about the difference currents δIb and δId. When the LD100 deteriorated in characteristic is driven using data at a temperature of 73° C. shown in FIG. 5 when the temperature of the LD100 is 73° C., for example, the bias current is determined based on the value of Ib(0)+δIb and the modulating current is determined based on the value of Imod(0)+δId−δIb.

Data about currents Ib(0), Imod(0) and Id(0) for each predetermined temperature, each of which corresponds to the intended emission power, are initially stored in the initial data region Eini shown in FIG. 5. The data about those currents Ib(0), Imod(0) and Id(0) are externally downloaded through the micon interface MCIF, for example. The down-loaded data can be written into the flash memory 173 under the control of the CPU170. Alternatively, the data can also be written therein in a boot program mode in a microcomputer manufacturing process.

The correction data region Ecor shown in FIG. 5 is first initially set to a value like "0". The CPU170 calculates correction driving control data according to the degree of deterioration of the LD100 and stores it therein. The once-stored correction driving control data is updated each time the deterioration of the LD increases or develops.

<<Driving Control of LD>>

A procedure for generating data for driving control of the LD100 and correction driving control data therefor, using the driving control data table will be explained based on FIG. 9.

After power-on has been reset (S1), the CPU170 detects the temperature through a cooling process to be described later (S2). The temperature detection is carried out by obtaining data detected by the temperature sensor 112 through the A/D conversion channel ADC4. The CPU170 reads initial driving control data and correction driving control data corresponding to the detected temperature from the driving control data table TBL (S3). The read data are defined as the data about the initial bias current Ib(0), the data about the initial modulating current Imod(0), the data about the driving current Id(0) obtained by summing up them, the data about the difference bias current δIb, the data about the difference driving current δId and the data about the driving current Id(t). The CPU170 sets data of Ib(0)+δIb to the D/A conversion channel DAC1 based on the read data and controls a bias current to be supplied to the LD100 through the transistor Tr1 (S4). Further, the CPU170 sets data of Imod(0)+δId−δIb to the D/A conversion channel DAC2 and controls a modulating current to be supplied to the LD100 through the transistor Tr2 (S5). Since the correction data region Ecor of the driving control data table TBL is filled with such a predetermined initializing code that all the bits are "0", δId=0 and δIb=0 when the optical transmission control device 1 is in first use. The emission intensity or power is controlled fixedly by starting bias current control and modulating current control and executing the auto power control by the APC111.

When a predetermined interval has elapsed, the CPU170 detects the temperature in a manner similar to the above according to a timer interrupt or the like (S6) and reads data about Id(0) and Id(t) in the column corresponding to the detected temperature. If Id(t)=0, then the CPU170 recognizes Id(0) as a driving current corresponding to the detected temperature. If Id(t)≠0, then the CPU170 recognizes Id(t) as a driving current corresponding to the detected temperature at that time (S7) Since the so-recognized driving currents (also called simply regulated driving currents Idregu) are based on the temperature detected in the temperature detection Step S6 different from Step S2, the driving currents might be different from the driving currents set in Steps S4 and S5 if an atmosphere temperature changes.

Next, the CPU170 obtains the values of voltages applied to the emitters of the transistors Tr1 and Tr2 through the A/D conversion channels ADC1 and ADC2 to thereby measure a driving current subjected to auto power control under the driving current control in Steps S4 and S5 and actually supplied to the LD100 (S8). The so-measured actual driving current is simply called monitor driving current Idmoni.

The CPU170 determines whether the measured monitor driving current Idmoni exceeds a range X allowable for the regulated driving current Idregu and increases (S9) The allowable range X is a range in which a quenching failure and an emission delay due to an increase in bias current under the auto power control substantially show no problem in the regulated driving current Idregu at the temperature at that time, for example. This is equivalent to a current corresponding to a few % or so of the regulated driving current Iregu, for example. Namely, whether the monitor driving current Idmoni exceeds the range X allowable for the regulated driving current Idregu will be defined as a decision index indicative of whether non-negligible deterioration in characteristic occurs in LD100.

If the monitor driving current does not exceed the allowable range X, then the CPU170 determines that no non-negligible deterioration in characteristic has occurred in the LD100 in relation to the temperature detected in Step S6 and is returned to the process of Step S2, where the temperature detection is done again, and thereafter the driving current control of the LD100 is updated based on driving control data at the corresponding temperature.

If it is detected that the monitor driving current has exceeded the allowable range X, then the CPU170 determines that the non-negligible deterioration in characteristic has occurred in the LD100 in relation to the temperature detected in Step S6 and performs a process of Step S10. First, the CPU170 sets data about the monitor driving current Idmoni obtained in Step S8 as data about a driving current Id(t) subsequent to the deterioration of the characteristic and sets data about the difference between the monitor driving current Idmoni and the regulated driving current Idregu as data about a correcting difference driving current δId. Further, the CPU170 acquires data about a correcting difference bias current δIb by the calculation of δId·α. Thereafter, the CPU170 writes the data about the driving current Id(t) subsequent to the characteristic deterioration, the data about the correcting difference driving current δId and the data about the correcting difference bias current δIb into a correction data region Ecor in the column corresponding to the temperature detected in Step S6. Thus, correction data corresponding to the non-negligible characteristic deterioration developed in the LD100 is set to the correction data region Ecor in the column of the temperature detected in Step S6.

Thereafter, the routine procedure is returned to the process of Step S2 where the temperature detection is done again and the driving current control of the LD100 is updated based on driving control data at the corresponding temperature.

Figure 10:
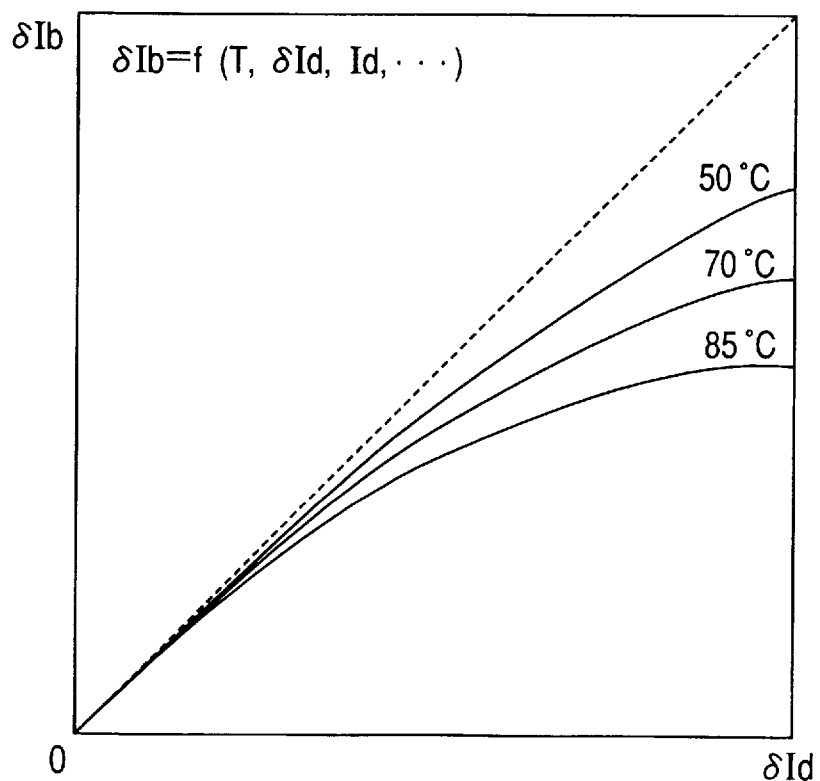
FIG. 10 is an explanatory view showing, as an example, the relationship between an increase $\delta Id$ in driving current and an increase $\delta Ib$ in bias current by auto power control.

Here, the operation expression of δIb=δId·α in Step S10 is one example approximately determined according to experimental data. The value of α may be determined in a range in which it does not exceed the threshold current of the LD100 subsequent to the characteristic deterioration, the emission delay is not excessively large and no undesired deformation occurs in emission waveform. For example, it can be set as α=0.8. Namely, when the characteristic of the laser diode deteriorates, a tendency shown in FIG. 10 could be obtained from experiments as a result of discussions by the present inventors as to the relationship between an increase δId in driving current and an increase in δib in bias current due to the auto power control. It was revealed that this was well fit to a tendency that if, based on it, the increase δId in the measured driving current is set to a factor of a constant α smaller than 1, the value obtained thereby is defined as an increase δIb in bias current, and the difference between the increase δId in the measured driving current and the increase δIb in bias current is given as an increase in modulating current, then an increase in driving current for obtaining fixed emission power would gradually increase according to the development of deterioration of the laser diode. Thus, when a method of setting the range allowable for the increase in driving current to the current value corresponding to the few % or so and updating the correction data according to the degree of the development of deterioration in the laser diode as described above is adopted, the calculation of the correction data becomes extremely easy and the accuracy capable of enduring practical use can be ensured.

Figure 11:
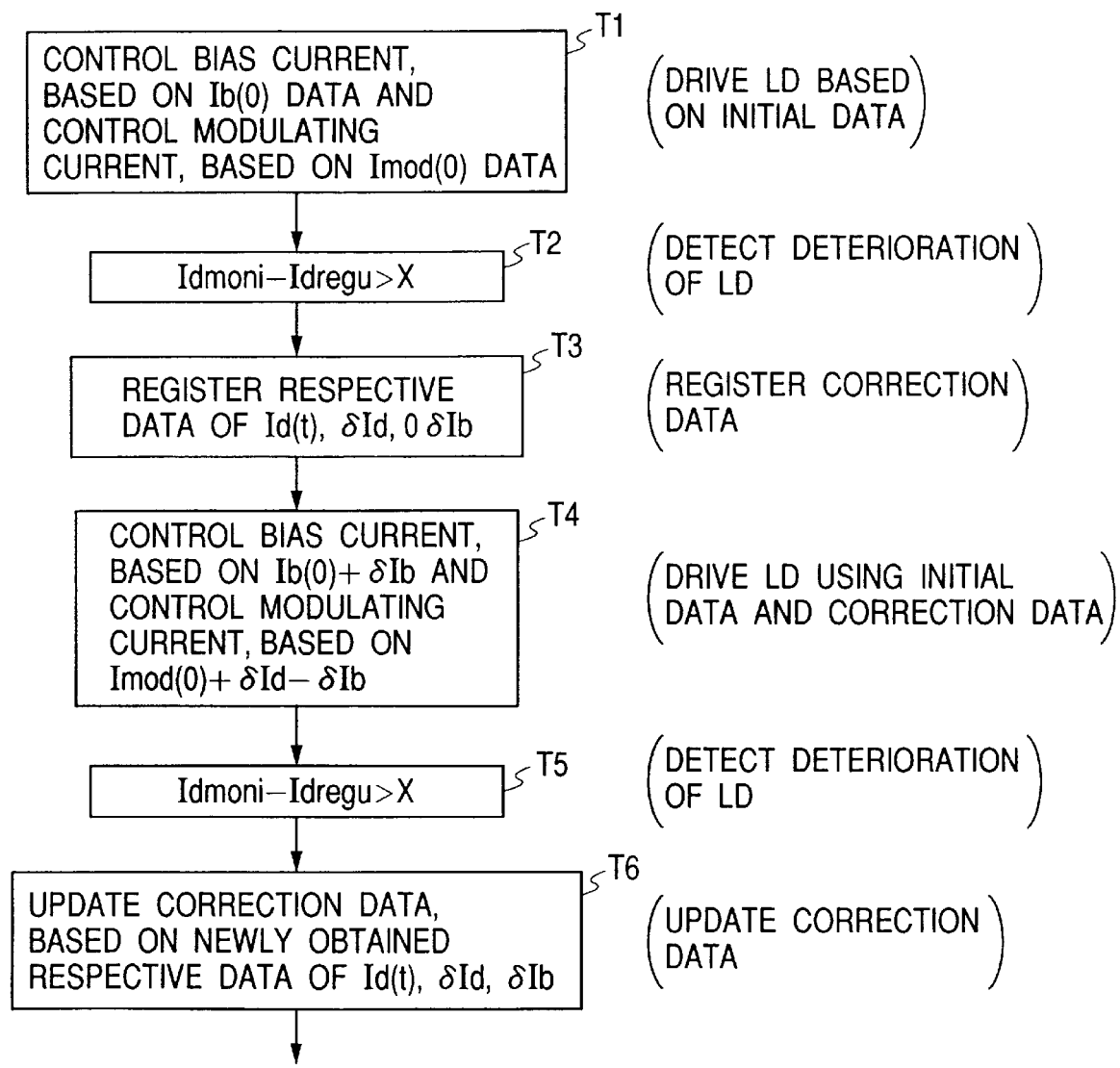
FIG. 11 is a flowchart illustrating the transition of the driving control of the LD according to a progress in characteristic deterioration of the LD.

FIG. 11 shows the driving control's contents allowed for the characteristic deterioration of the LD according to the progress of the deterioration of the LD. In FIG. 11, the temperature of the LD100 is focused on a constant temperature to simplify a display format. Since no substantial characteristic deterioration occurs in the LD upon the initial operation of the optical transmission device, the LD100 is driven by the data about the initial bias current Ib(0) and the data about the initial modulating current Imod(0) (T1). When the actualized deterioration of LD100 is detected according to the above Idmoni−Idregu>X (T2), correction data about a driving current Id(t), a difference current δId and a difference bias current δIb are registered in their corresponding temperature column of the driving control data table TBL in the above-described manner (T3). The LD100 under the temperature at which the correction data have been registered, is subjected to bias current control by Ib(0)+δIb and subjected to modulating current control by Imod(0)+δId−δIb (T4) When the deterioration of the LD further proceeds, the deterioration of the LD100 is detected according to the Idmoni−Idregu>X (T5). Idregu at this time is determined in consideration of correction data in a manner similar to the driving current control in T4. Thus, correction data about a driving current Id(t), a difference current δId, and a difference bias current δIb, which are obtained in the next T6, are determined in consideration of the correction data which have been used so far. The so-obtained new correction data about the driving current Id(t), difference current δId and difference bias current δIb are registered in their corresponding temperature column of the driving control data table TBL so that the correction data are updated (T6). T4 through T6 are hereafter repeated until the deterioration of the LD100 reaches a specific limit value. On such occasions, the correction data are updated. Incidentally, the limit value for the deterioration of the LD100 can be defined as when the bias current reaches twice the current value determined based on the data about Ib(0). The state thereof can be simply grasped by comparing data about each bias current sampled through the A/D conversion channel ADC1 and the data about Ib(0).

According to the driving control method for the LD100, which has taken into consideration the characteristic deterioration, the driving current of the LD100 is controlled using the driving control data corresponding to the detected temperature. Upon determination of the degradation of the LD100, the ambient temperature of the LD100 is further measured and a decision is made as to whether the difference δId between a driving current defined by driving control data corresponding to the newly measured temperature and an actual driving current formed by the auto power control exceeds an allowable value. When the difference is found to exceed the allowable value, it is determined that the deterioration of the LD100 is advanced. Thus, a distinction between whether the increase in driving current due to the auto power control results from the deterioration of the LD100 and whether it results from a variation in ambient temperature is reliably made. The driving control data corresponding to the corresponding temperature is updated based on the difference δId between the driving currents used to determine the deterioration of the LD100. After the renewal of the driving control data, the driving current for the LD100 is controlled using the updated driving control data. Thus, a quenching failure and an emission delay are limited to the minimum with respect to both the change in ambient temperature and the characteristic deterioration of the LD100 due to secular changes, whereby an optical output can be kept constant.

<<Relaxation of Change in Wavelength>>

The driving current of the LD100 increases as the characteristic deterioration proceeds. An increase in driving current will cause a rise in the temperature. It is known that in the laser diode, a variation in wavelength relative to a change in temperature of 1° C. is normally 0.07 nm and the wavelength varies by about 0.1 nm each time the bias current increases by 30 mA. Wavelength-division multiplexing transmission and high-speed optical transmission need to strictly control the variation in wavelength. In order to meet such a demand, a cooling device 200 such as a Peltier device, a cooling driver 201 and a D/A conversion channel DAC3 for supplying driving data to the cooling driver 201 can be added to the optical transmission device shown in FIG. 3.

Figure 9:
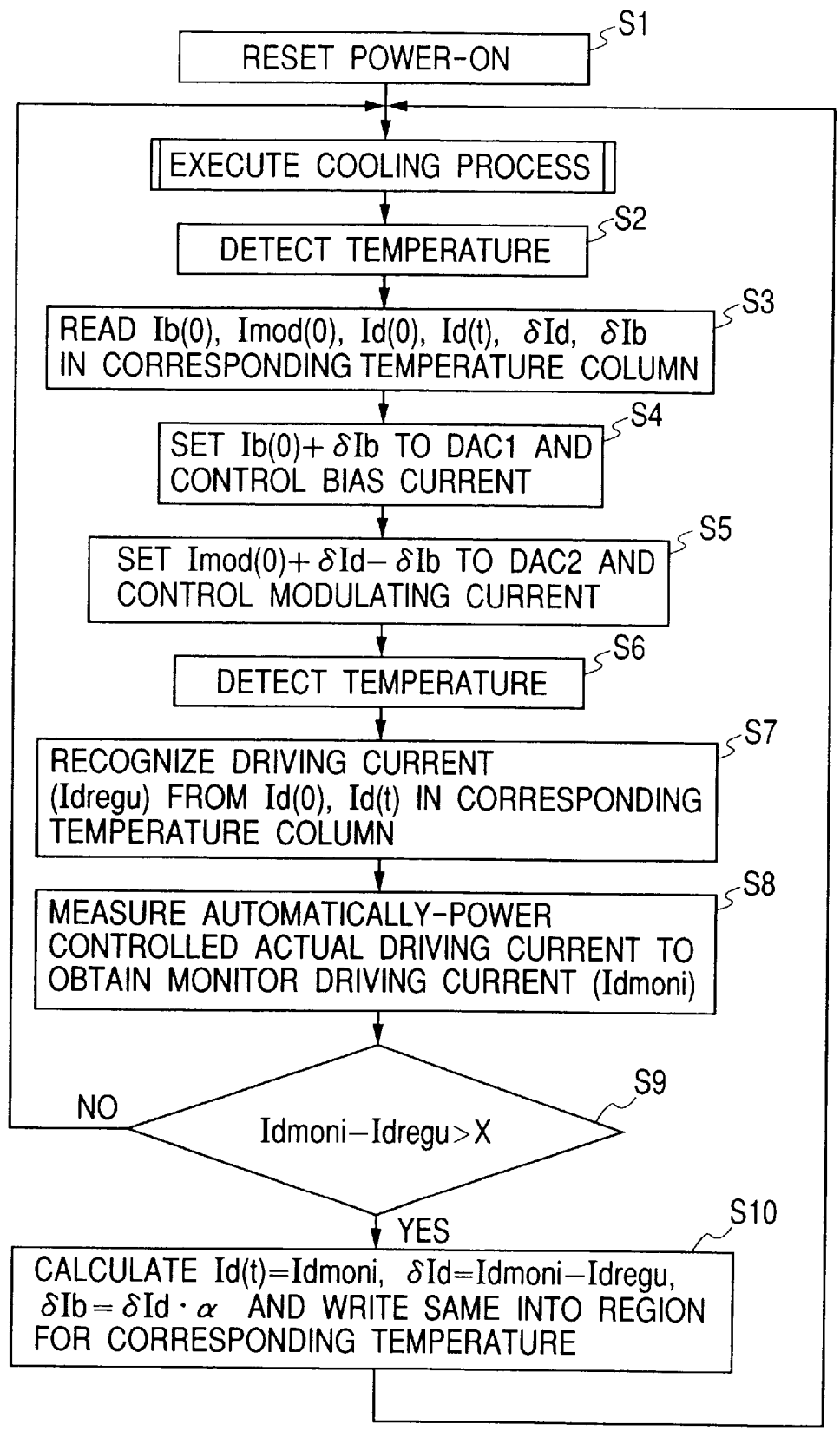
FIG. 9 is a flowchart depicting a procedure for generating data for driving control of the LD using the driving control data table and correction driving control data therefor.
Figure 12:
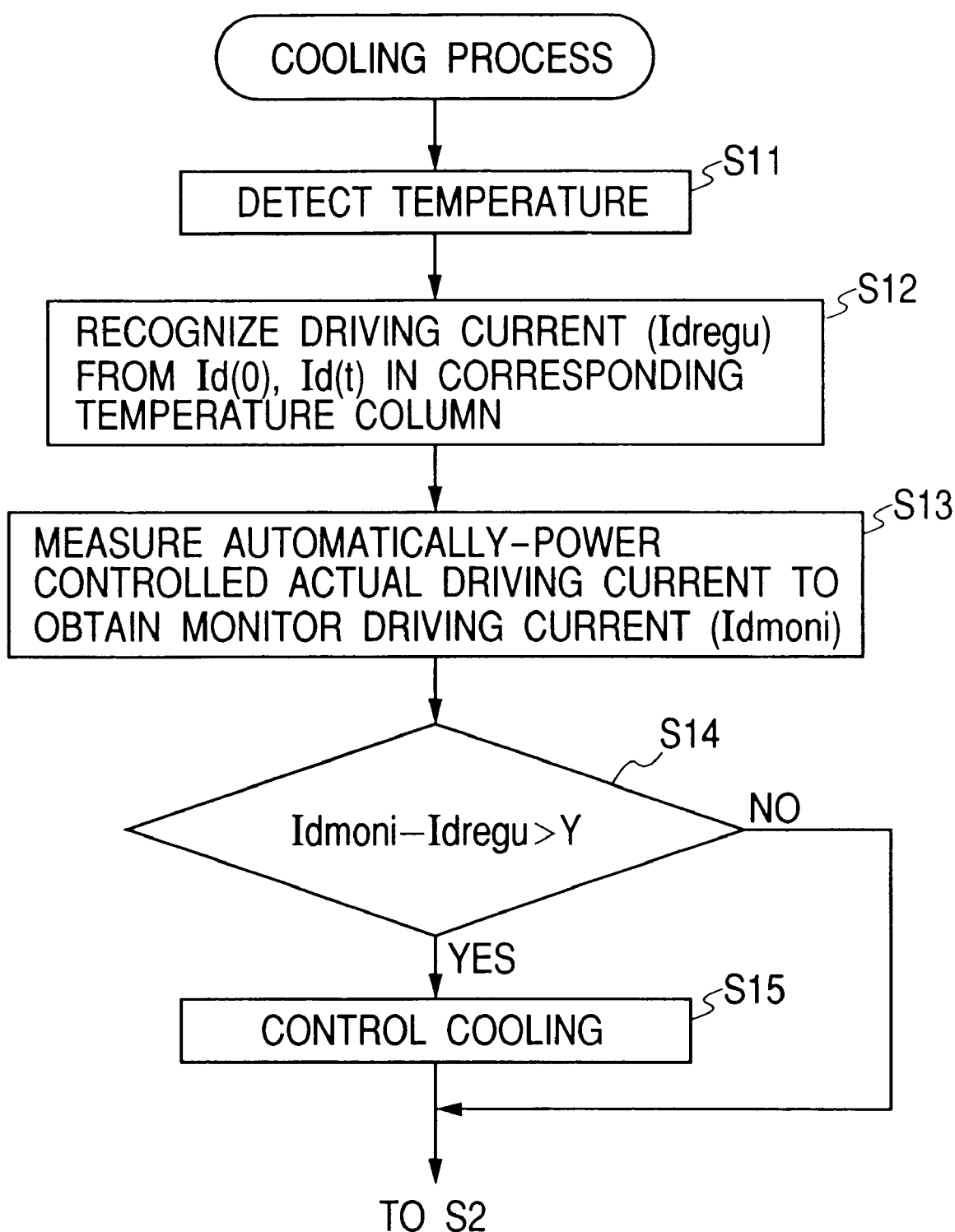
FIG. 12 is a flowchart showing one detailed example of a cooling process.

When the construction for relaxing the change in wavelength is added, the CPU170 performs the cooling process shown in FIG. 9. One detailed example of the cooling process is shown in FIG. 12. In the cooling process, a temperature detecting process (S11), a process for recognizing a regulated driving current Idregu (S12) and a process for obtaining a monitor driving current Idmoni (S13) similar to Steps S6, S7 and S8 referred to above are carried out. It is determined whether the difference between the regulated driving current Idregu and the monitor driving current Idmoni has exceeded a predetermined value Y (S14). If it is now desired to relax a change in wavelength of 0.1 nm or more, then the change in wavelength of 0.1 nm occurs when an increase in driving current is about 30 mA. Since it corresponds to a rise in the temperature of about 1.4° C., of the LD100, the predetermined value Y can be set to a value indicative of, for example, 15 mA or 30 mA or the like. When the result of determination in Step S14 exceeds the value Y, cooling driving data for lowering the temperature of the LD100 by a predetermined temperature is loaded into the cooling driver 201 through the D/A conversion channel DAC3 to thereby activate the cooling device 200. If the value Y is a value equivalent to 15 mA, for example, then control for reducing the temperature of the LD100 by 0.7° C. is carried out. If the value Y is a value equivalent to 30 mA, then control for reducing the temperature of the LD100 by 1.4° C. is performed.

With respect to the increase in driving current due to the characteristic deterioration of the LD100, the relaxation of the variation in wavelength by cooling and the process for correcting the driving control data are carried out independently of each other.

While the invention made by the present inventors as described above has been described specifically by the illustrated embodiments, the present invention is not limited to the embodiments. Various changes can be made thereto within the scope not departing from the substance thereof.

For example, the emission output to be outputted from the optical transmission device 1 is one having the property of being physically determined according to a communication environment under which it is placed. For example, it can be notified to the CPU170 in accordance with an operating program of the CPU170, external instructions or a signal outputted from a circuit like a dip switch. When emission power corresponding to each driving control data held by a driving control data table and instructed emission power are different from each other, the driving data in the driving control data table can be used by taking a factor of a ratio corresponding to a ratio between both data.

The initial driving control data can be generated by actually operating the optical transceiver 1T and based on the result of measurement of each current flowing in the laser diode. If such a generating method is used, it is then possible to obtain the initial driving control data which has taken into consideration the difference between the temperature characteristic of the laser diode and the temperature characteristic of the transistor of the LD driver.

The optical transmission device is not limited to the embodiment of the interface board illustrated in FIG. 2. For example, the optical transceiver can take a form used as an optical transceiver module or optical transmission module incorporated in a casing. The order in which the driving data setting process of the LD (S2 through S5 in FIG. 9), the data correcting process corresponding to the characteristic deterioration of the LD (S6 through S10 in FIG. 10) and the cooling process are carried out, is not limited to that shown in FIG. 9.

INDUSTRIAL APPLICABILITY

The present invention can be widely applied to an optical transmission system such as a PDS (Passive Doubler Star) or the like in which an optical fiber is introduced into subscribers of telephones and ISDN, and an ATM-LAN (Asynchronous Transfer Mode—Local Area Network) or the like.

What is claimed is:

1. An optical transmission device, comprising:
   a laser diode;
   a current supply circuit for supplying a bias current and a modulating current superimposed on the bias current to said laser diode as driving currents;
   an automatic optical output control circuit for supplementing the shortage of the driving currents so that emission power of said laser diode is held constant;
   a temperature detection circuit for detecting an ambient temperature of said laser diode;
   memory means for storing driving control data for determining a modulating current and a bias current necessary to obtain predetermined emission power therein for each predetermined temperature; and
   control means for obtaining driving control data corresponding to the temperature detected by said temperature detection circuit from said memory means, controlling each driving current, to be supplied from said current supply circuit to said laser diode, based on the obtained driving control data, measuring each driving current actually supplied to said laser diode whose emission power is held constant by said automatic optical output control circuit, detecting whether the difference between the measured driving current and a driving current determined according to the driving control data corresponding to the detected temperature at that time exceeds an allowable range, and updating the driving control data related to the temperature, on said memory means when said difference exceeds the allowable range so that the difference between the driving currents is defined as each of increases in bias current and modulating current.

2. The optical transmission device according to claim 1, wherein said driving control data comprises initial data for initially determining the bias current and the modulating current for each predetermined temperature and correction data subsequently added to the initial data, and said correction data is data for defining the difference between the driving currents as each of the increases in bias current and modulating current.

3. The optical transmission device according to claim 2, wherein said control means allows data about the difference between the driving currents and a value obtained by increasing the difference between the driving currents by a factor of a constant ratio smaller than 1 to be included in said correction data as data about an increase in bias current, determines a bias current by the sum of the initial bias current data included in the initial data and the data about the increase in bias current included in the correction data when the driving current for said laser diode is determined based on the initial data and the correction data, and adds the initial modulating current data included in the initial data to the difference between the data about the difference between the driving currents and the data about the increase in bias current respectively included in said correction data to thereby determine a modulating current.

4. The optical transmission device according to claim 3, wherein said control means includes a central processing unit and a program memory storing an operating program thereof therein, and said memory means is an electrically programmable non-volatile semiconductor memory accessible by said central processing unit.

5. The optical transmission device according to claim 1, further including a cooling device capable of selectively cooling said laser diode, and wherein said control means allows said cooling device to lower an ambient temperature of said laser diode by a predetermined temperature each time the difference between the driving currents reaches a predetermined value with respect to the driving currents defined by the driving control data.

* * * * *